(12) United States Patent
Buchner et al.

(10) Patent No.: US 8,136,478 B2
(45) Date of Patent: Mar. 20, 2012

(54) DEVICE AND A METHOD FOR APPLYING AN EVEN, THIN FLUID LAYER TO SUBSTRATES

(75) Inventors: Christian Buchner, Neckargmuend (DE); Johann Brunner, Birkenfeld (DE); Helmut Kalmbach, Freudenstadt (DE); Josef Gentischer, Weinstadt (DE)

(73) Assignee: Schmid Technology Systems GmbH, Niedereschach (DE)

( * ) Notice: Subject to any disclaimer, the term of this patent is extended or adjusted under 35 U.S.C. 154(b) by 1136 days.

(21) Appl. No.: 11/918,981

(22) PCT Filed: Mar. 28, 2006

(86) PCT No.: PCT/EP2006/002797
§ 371 (c)(1),
(2), (4) Date: Oct. 22, 2007

(87) PCT Pub. No.: WO2006/111247
PCT Pub. Date: Oct. 26, 2006

(65) Prior Publication Data
US 2009/0053397 A1 Feb. 26, 2009

(30) Foreign Application Priority Data

Apr. 22, 2005 (DE) .......................... 10 2005 019 686

(51) Int. Cl.
*B05D 5/12* (2006.01)
*B05C 11/00* (2006.01)
*B05B 13/02* (2006.01)
(52) U.S. Cl. ........................... 118/695; 118/324; 427/74
(58) Field of Classification Search .................. 427/74; 118/324, 325, 695
See application file for complete search history.

(56) References Cited

U.S. PATENT DOCUMENTS

| | | | |
|---|---|---|---|
| 6,349,668 B1 * | 2/2002 | Sun et al. | 118/723 R |
| 2003/0039766 A1 * | 2/2003 | Barnes et al. | 427/569 |
| 2005/0037142 A1 | 2/2005 | Chartrel | |
| 2006/0071966 A1 * | 4/2006 | Nagashima | 347/20 |

FOREIGN PATENT DOCUMENTS

| | | |
|---|---|---|
| DE | 44 02 758 A1 | 8/1995 |
| DE | 199 24 108 A1 | 11/2000 |
| DE | 10 2005 019686 B3 | 4/2006 |
| JP | 2000-5668 | 1/2000 |
| WO | WO 93/16812 | 9/1993 |

* cited by examiner

*Primary Examiner* — James Lin
*Assistant Examiner* — Austin Murata
(74) *Attorney, Agent, or Firm* — Bacon & Thomas, PLLC

(57) ABSTRACT

A device for applying an even, thin fluid layer, in particular a phosphoric acid layer, onto substrates, in particular silicon cells for photovoltaic application, is provided with a process chamber, which is provided with a fluid pan and a high-frequency ultrasound device that converts the fluid into fluid mist, and with a transport device that is arranged beneath a fluid-mist dropping shaft of the process chamber for the substrates. To create a device of this type, which permits an application of the fluid onto the silicon cells in question that is substantially more homogeneous regarding both surface area and volume, the fluid-mist dropping shaft of the process chamber tapers in its interior cross-section towards the transport device and discharges into a passage shaft arrangement for the substrates that covers the transport device, and the interior cross-section of the orifice end of the fluid-mist dropping shaft and of the passage shaft arrangement are coordinated with each other, preferably being essentially identical.

24 Claims, 2 Drawing Sheets

DEVICE AND A METHOD FOR APPLYING AN EVEN, THIN FLUID LAYER TO SUBSTRATES

TECHNICAL FIELD

Figure 1:
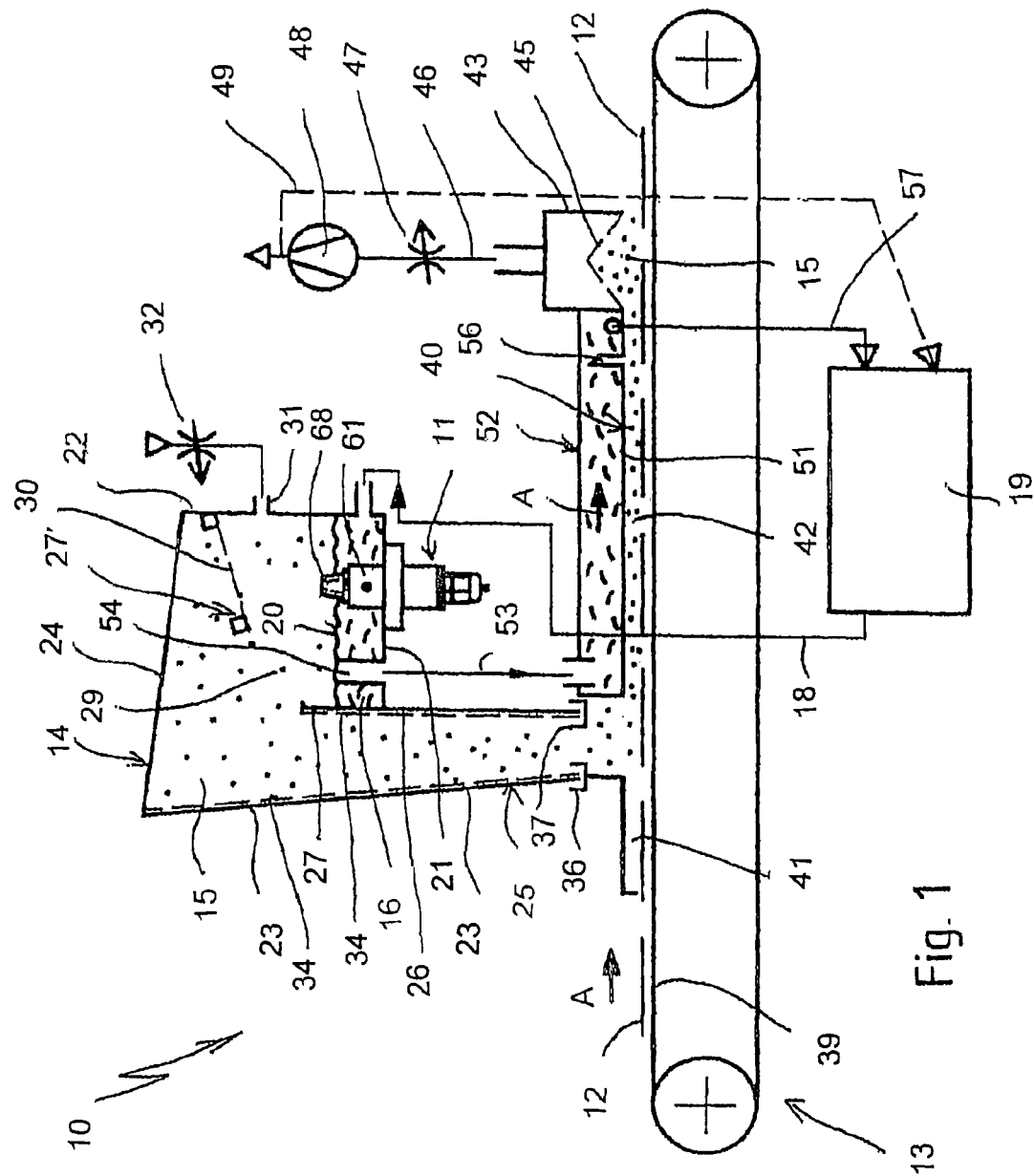

The present invention relates to a device for applying an even, thin fluid layer, in particular a phosphoric acid layer, to substrates, in particular silicon cells for photovoltaic application, as well as a method for applying an even, thin fluid layer, in particular a phosphoric acid layer, to substrates, in particular silicon cells for photovoltaic application.

BACKGROUND DISCUSSION

To be able to manufacture photovoltaic cells made of silicon, a phosphorus doping of the unfinished cells is first necessary. In the first step, the cell is wetted using phosphoric acid, and the wetted cells are placed in a high-temperature oven at ca. 800° to 900° C., where the phosphorus diffuses from the dried acid into the silicon substrate. The coating is designed to be very even to achieve equal distribution in the diffusion process, and it is also designed to be very economical since the excess phosphoric acid melts onto the cell as "phosphorus glass," and it can only be removed using hydrofluoric acid, which is accomplished with difficulty.

Phosphoric acid is usually applied to the silicon substrates in such a way that the phosphoric acid is atomized by a high-frequency ultrasound device, and the phosphoric acid mist is deposited onto the silicon substrates. The phosphoric acid mist is conveyed from the process chamber into a dropping shaft, which is relatively wide and is arranged at a relatively large distance above the silicon substrates, i.e., cells, that are conveyed past it. One disadvantage in this known device lies in the fact that it offers no guarantee that the mist will be homogenized, because even light air currents are sufficient to "blow" the mist. In addition, the configuration of the process chamber leads to damaging condensate drops falling onto the silicon cells, which works against achieving a homogeneous wetting or coating result. The attempt has been made to catch condensate drops of this type using a drip pan beneath the dropping shaft, which however has the effect of preventing the mist even more from being evenly spread.

SUMMARY OF THE INVENTION

The objective of the present invention is therefore to create a device for applying an even, thin fluid layer, in particular a phosphoric acid layer, onto substrates, in particular silicon cells for photovoltaic application of the aforementioned type, which permits an application of fluid, in particular phosphoric acid, onto the substrates in question, in particular the silicon cells, that is substantially more homogeneous with respect to both surface area and volume.

This objective is achieved for applying an even, thin fluid layer, in particular a phosphoric acid layer, onto substrates, in particular silicon cells for photovoltaic application of the aforementioned type by the provision of a process chamber which is provided with a fluid pan and a high-frequency ultrasound device that converts the fluid into fluid mist. A transport device is provided that is arranged beneath a fluid-mist dropping shaft of the process chamber for the substrates, wherein the fluid-mist dropping shaft of the process chamber tapers in its interior cross-section towards the transport device and discharges into a passage shaft arrangement for the substrates that covers the transport device. The interior cross-section of an orifice end of the fluid-mist dropping shaft and of the passage shaft arrangement are coordinated with each other, preferably being essentially identical.

The measures proposed according to the invention achieve, within an essentially closed circulation system, both homogeneous mist creation as well as a homogeneous conveying of the fluid mist from the production location (process chamber) to the application location, as well as during the application to the substrates, in particular silicon cells. This homogeneity relates to deposition on the silicon substrates in terms of both surface area and quantity. In addition, the fluid mist is compressed and additionally homogenized due to the tapering of the fluid-mist dropping shaft and the resulting backing up of the mist.

Design of the dropping shaft that is simple from the point of view of manufacturing technique is realized by a fluid-mist dropping shaft that is wedge-shaped in the direction of the passage shaft arrangement.

On the passage shaft arrangement in the direction downstream of the orifice of the dropping shaft, a return shaft is arranged that is connected to the fluid pan, the rear end of the return shaft that faces away from the orifice being connected to a fluid tank, and the cover of the passage shaft arrangement disposed above the silicon substrates, which are passing by, is maintained at a certain temperature, so that the fluid mist cannot condense and thus drop formation is not possible, which also promotes the homogeneity of the fluid mist and of its application.

In an area above the high frequency ultrasound device an air supply pipe that is connected to a first regulating device discharges, and/or at the end of the passage shaft arrangement an air discharge channel is provided that is connected to a second regulating device. As a result, a regulatable, homogeneous, and active conveyance of the fluid mist is achieved from the point of origin to the point of application, as well as during the application phase. In this context, when the exhaust air duct is used, it is expedient to provide between the passage shaft arrangement and the air discharge channel an extractor box that is provided with a laminar flow box that is connected to a suction fan, so as to not impair the homogeneity of the fluid mist at the passage end of the shaft arrangement and to impart to the fluid mist a defined flow velocity.

In a preferred and advantageous manner, the first and second regulating device can be coordinated with each other, preferably synchronized for the velocity of the mist as it moves from the process chamber through the passage shaft arrangement and the velocity of the transport device for the substrate. This provides that the fluid mist is deposited evenly and in sufficient quantity on the silicon substrates due to the gravity that acts upon the fluid mist and the duration of the reaction time extending beyond the time needed for transport.

In the area where the fluid mist is produced, an impact element is provided, which has the advantage that its plastic web catches the fluid without spatter and causes it to flow back into the fluid pan. An advantageous configuration for this purpose can be derived from a passage provided between the free end of the tilted impact element, which emerges from a process chamber wall that faces away from the dropping shaft and a dam that is arranged on the end of the fluid pan that faces away from this process chamber wall.

The cover of the process chamber is tilted at a rising slope as it emerges from the process chamber wall that faces away from the dropping shaft. This configuration of the cover of the process chamber has the advantage, regarding the homogeneity of the fluid mist, that the condensate that collects there can be conveyed back to the fluid pan due to the tilted arrangement.

Measures are provided in the fluid-mist dropping shaft that are capable of removing the condensate that forms on the walls of the dropping shaft without permitting drops to form. For this purpose, it is expedient to provide, runoff channels, wherein the bordering walls of the dropping shaft terminate in an orifice area of the passage shaft arrangement so that the condensate can be drained off to the side via the channels.

A multiplicity of high-frequency ultrasound devices are provided at pre-established intervals in this direction. This has the advantage that the width of a device of this type can be extended to a virtually unrestricted degree.

In the known device cited above, a high-frequency ultrasound device is used whose high-frequency ultrasound transmitter, or generator, is not resistant to phosphoric acid. Therefore, it is necessary to use an intermediate receptacle that is filled with water, evacuated, and connected to a tempering circuit. The high-frequency ultrasound generator is attached on the lower side of the intermediate receptacle, and a diaphragm is attached on the upper side of the intermediate receptacle, whereby the water and the diaphragm function to transfer the sound from the high-frequency ultrasound transmitter to the phosphoric acid basin or pan, situated above it. Disadvantageous in this respect are the cumbersome and expensive technology, the frequent ruptures of the diaphragm due to fatigue, the resulting laborious and time-consuming process of replacing the diaphragm, and the damping characteristics of a sound transfer means of this type.

To avoid these disadvantages, the high-frequency ultrasound device for atomizing the fluid is provided with a nozzle, preferably made of quartz glass, beneath which a high-frequency ultrasound generator is arranged.

As a result of the measures according to the present invention, both the phosphoric acid and the sound are focused in the quartz glass nozzle. It is expedient to provide between the nozzle that protrudes from the fluid surface in the fluid pan and a high-frequency ultrasound generator to allow the fluid to flow from the fan into the nozzle, so that the fluid that is compressed in the quartz glass nozzle can flow back through the supply lines.

One preferred design configuration in this regard is indicated by the nozzle being held in a housing, preferably made of plastic, which is secured on a base of the fluid pan and penetrates this base in a fluid-tight matter, the high-frequency ultrasound generator being attached in the housing in the area of the fan base, and a multitude of radial supply boreholes provided in the part of the housing that is located within the fluid fan.

A piezoelectric element as the high-frequency ultrasound generator, on which a quartz glass plate is attached, preferably glued, which forces the nozzle and is coordinated with the ultrasound frequency, enables the high-frequency ultrasound device to be in essence directly connected to the phosphoric acid without resulting in disadvantages regarding the intensity of the high-frequency ultrasound generation.

Furthermore, the present invention relates to a method for applying an even, thin fluid layer, in particular a phosphoric acid layer, onto substrates, in particular silicon cells for photovoltaic application As previously mentioned, the heretofore comparable methods demonstrate a lack of homogeneity in the conveying of the fluid mist and therefore in the depositing of the phosphoric acid.

To improve this aspect of a method of the aforementioned type, a high-frequency ultrasound device generates a fluid mist which settles, i.e., is deposited, on substrates that are preferably moved by a transport device, wherein the fluid mist is actively moved out of the process chamber on its way to the substrates, is compressed and homogenized in a dropping shaft that is connected to the process chamber, from there is conveyed into a passage shaft arrangement that is arranged over the moving substrates, and is deposited upon the substrates, whereby the active process of moving the fluid mist is coordinated with the velocity of the substrates, preferably being synchronized therewith.

On the basis of the measures according to the invention, the fluid mist can be actively and homogeneously conveyed from the point of generation of the fluid mist to the point of application, or deposition, of the fluid-mist layer onto the substrates.

Further details of the present invention can be derived from the following description, in which the invention is described and discussed in greater detail on the basis of the exemplary embodiment depicted in the drawing.

BRIEF DESCRIPTION OF THE DRAWINGS

FIG. 1 is a schematic and partial longitudinal cutaway side view, depicts a device for applying an even, thin phosphoric acid layer onto silicon substrates for photovoltaic application, and FIG. 2 depicts a high-frequency ultrasound device that is used in the device according to FIG. 1 in the installed state and in cross-section.

DETAILED DISCUSSION

Device 10 as depicted in FIG. 1 functions to apply an even, thin phosphoric acid layer to silicon substrates, or cells, 12 for photovoltaic application. In this context, silicon substrates 12 are transported in and out on a transport device 13 in the direction of arrow A, and during the transport motion become homogenous with respect to a phosphoric acid layer as a result of the fact that silicon substrates 12 are conveyed through a phosphoric acid mist 15 which is generated by a high-frequency ultrasound device 11 within a process chamber 14.

According to FIG. 1, a pan 16 containing phosphoric acid is arranged on the base of process chamber 14 that extends over a defined length perpendicular to the plane of the drawing. Phosphoric-acid pan 16 is connected via a tubular line 18 to a phosphoric-acid tank 19. Advantageously, the phosphoric acid from this tank 19 in pan 16 is tempered as needed. High-frequency ultrasound device 11, which is described below in greater detail on the basis of FIG. 2, is attached on base 21 of fluid pan 16.

In accordance with FIG. 1, process chamber 14 is bordered by a right sidewall 22, an opposite left sidewall 23, a cover 24, and undepicted end walls that are parallel to the plane of the drawing. Process chamber 14, which is situated above fluid tank 19, is provided in its area facing left sidewall 23 with a dropping shaft 25 that points towards transport device 13. Cover 24 of process chamber 14 is arranged so as to diagonally slope from right sidewall 23, and it is sealingly joined to left sidewall 23, which in its extension 23' that points towards transport device 13 forms the sidewall of dropping shaft 25. This sidewall 23, 23' is tilted diagonally towards transport device 13 in the direction of right sidewall 22, so that a dropping shaft 25 results that tapers, i.e., is roughly wedge-shaped, whose opposite side wall 26 extends vertically and therefore parallel to right sidewall 22 of process chamber 14, which is located higher up. This sidewall 26 of dropping shaft 25 borders fluid pan 16 and extends beyond fluid surface 20 of fluid pan 16, creating a dam 27.

In the upper area of right sidewall 22 of process chamber 14, an impact element 27 is attached, which, sloping diagonally downwards, i.e., towards fluid pan 16, protrudes into process chamber 14 and terminates at a distance before dam 27, creating a passage 29.

Impact element 28 has a frame that is covered with plastic web 30, whereby plastic web 30 in a spatter-free manner catches the phosphoric acid droplets within phosphoric acid mist 15 that are hurled by high-frequency ultrasound device 11, and it causes the droplets to flow back into fluid pan 16. Thus only the phosphoric acid mist goes through passage 29 and plastic web 30 of impact element 28 into the space of process chamber 14 situated behind them. Plastic web 30 of impact element 28 also permits the condensate that collects on cover 24 of process chamber 14 and that flows back towards right sidewall 22 to pass through and flow off into fluid pan 16.

In the area between fluid surface 20 of pan 16 and impact element 28, an air supply connector 31 is provided, whose supply line is furnished with a regulating device 32. In this way, the phosphoric mist that is produced is pushed, i.e., actively moved through regulatable air supply line 31, 32, and over dam 27 towards the intake of dropping shaft 25.

Both the parts of left sidewall 23, 23', which pass into each other, as well as sidewall 26 of dropping shaft 25 are provided with a web covering 34, so that the condensate of phosphoric acid mist 15 that is deposited on the walls of dropping shaft 25 can be conducted away from this web covering 34 towards the bottom without the formation of drops. For this purpose, the lower edges of sidewalls 23, 23', and 26 terminate above channels 36 and 37, which drain the condensate off to the side in a manner that is not depicted in detail, i.e., in a direction that is perpendicular to the plane of the drawing.

Above transport device 13, i.e., upper side 39 of transport device 13, on which silicon substrates 12 lie and are moved in the direction of arrow A, a passage shaft arrangement 40 is provided which has an intake area 41 upstream of dropping shaft 25 and an outlet area 42 downstream of dropping shaft 25. Between intake area 41 and outlet area 42, shaft arrangement 40 is open on the top, dropping shaft 25 discharging into this open area. At the rear end in the direction of passage A, outlet area 42 of shaft arrangement 40 is provided with an extraction box 43, within whose opening, which is facing side 39 of transport device 13, a roof-shaped plastic web 45 is arranged so as to create a laminar flow box. At this end of extractor box 43, facing away from this plastic web 45, an extractor line 46 is attached, in which a regulating device 47 is arranged that has a suction fan 48 for actively moving phosphoric acid mist 15, i.e., causing it to flow. Behind suction fan 48 a condensate return line 49 is provided which discharges into phosphoric acid tank 19.

Based on both regulating devices 32 and 47 for supplying and removing air, phosphoric acid mist 15, once produced, can be moved in regulatable fashion from its production location, namely process chamber 14, via dropping shaft 25, which extends below process chamber 14 and fluid pan 16, into shaft arrangement 42 and finally to the location at which silicon substrates 12 are to be coated. Due to the wedge-shaped configuration of dropping shaft 25, the phosphoric acid mist is compressed by the backup and is homogenized. Because of the direct transition from dropping shaft 25 to relatively low shaft arrangement 40, phosphorus mist 15 remains homogeneous and compressed and therefore completely fills outlet area 42 of shaft arrangement 40. Because extraction box 43 uniformly suctions off the portion of phosphoric acid mist 15 that was not deposited from the entire width of outlet area 42 of shaft arrangement 40, the homogeneity of the phosphoric acid mist is maintained within outlet area 42. Therefore, due to the gravity acting upon the phosphoric acid mist and the duration of the reaction time extending beyond the time needed for transport, the phosphoric acid is deposited on substrates 12 evenly and in sufficient volume. The phosphoric acid mist is dosed in a sensitive manner by regulating the supply and removal of air as well as by regulating the power supplied to high-frequency ultrasound device 11. A homogeneous and (in time and space) even action of the phosphoric acid mist on silicon substrates 12 is also achieved due to the fact that the transport velocity of transport device 13 for silicon substrates 12 is coordinated with the velocity of the phosphoric acid mist 15 as it moves through the substantially closed circulation system from process chamber 14 via dropping shaft 25 and shaft arrangement 42 to extraction box 43, and the former is advantageously synchronized with the latter, i.e., is equal to it.

For an evenly homogeneous conveyance of phosphoric acid mist 15 over the entire path, it is important that the dimensioning or, in other words, the discharge end, of vertical fluid-mist dropping shaft 25 and of passage shaft arrangement 40 bordering the deposition chamber for substrates 12 are coordinated with each other, and preferably are identical.

In order to prevent condensate of phosphoric acid mist 15 from forming on cover 51 of shaft arrangement 40 beneath outlet area 42 of shaft arrangement 40, a return shaft 52 whose base is formed by cover 51 is provided above outlet area 42. Return shaft 52 is connected by a line 53 to a filling level tube 54 of phosphoric acid pan 16 in an area of the entry end of outlet area 42 of shaft arrangement 40, so that tempered phosphoric acid that overflows from pan 16 can flow over shaft arrangement 40 in transport direction A. At the end of return shaft 52 behind a dam-like element 56, a tubular line 57 is connected which returns the excess phosphoric acid to phosphoric acid tank 19.

Figure 2:
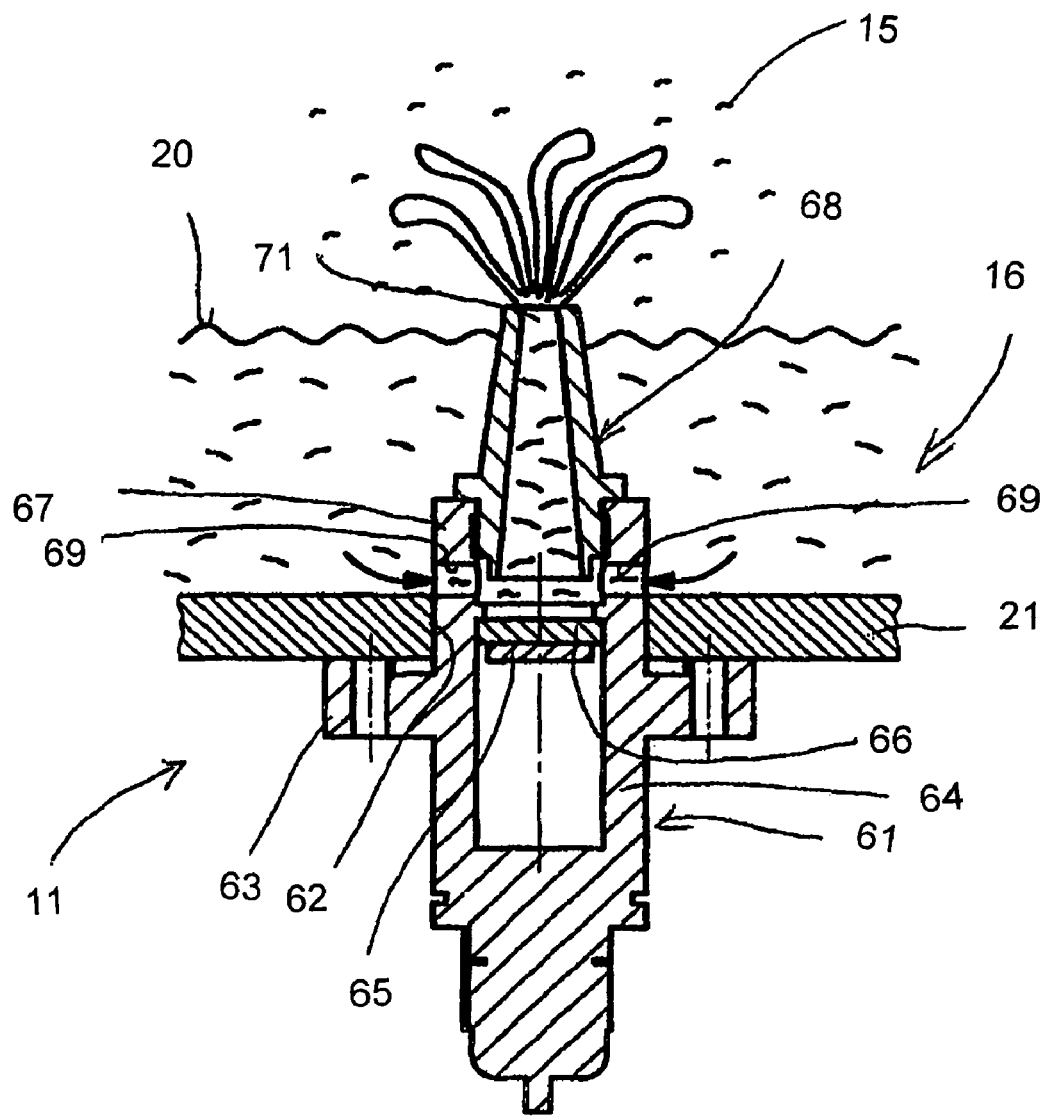

FIG. 2 in a detail of FIG. 1 depicts high-frequency ultrasound device 11 that is used in device 10, shown in a schematic longitudinal cutaway view. High-frequency ultrasound device 11 has a plastic housing 61, which penetrates a borehole 62 in base 21 of the phosphoric acid pan and is attached by a flange of 63 to the lower side of pan base 21. Within a lower hollow housing part 64 that is surrounded by flange 63, a piezoelectric element 65 is arranged which is located in the area of pan base 21 as the high-frequency ultrasound generator, whose lower side is provided in an undepicted manner with connecting lines and whose upper side is filled by and preferably glued to a quartz glass disk 66. The thickness of quartz glass disk 66 is coordinated with the high-frequency ultrasound frequency of piezoelectric element 65, so that the sound can be relayed virtually without loss. This unit, composed of piezoelectric element 65 and quartz glass disk 66, is installed in hollow housing part 64 so as to be hermetically sealed towards the lower side, the quartz glass disk being arranged first on the side facing the phosphoric acid in pan 16. A quartz glass nozzle 68 at its lower, larger-diameter end is screwed into upper hollow housing part 67, which constitutes an integral piece with hollow housing part 64 and protrudes into phosphoric acid pan 16. A multiplicity of radial bore holes 69 arranged around the circumference are introduced into upper hollow housing part 67, through which the phosphoric acid contained in pan 16 can flow into the space of quartz glass nozzle 68 and also come into contact with quartz glass disk 66. Quartz glass nozzle 68 tapers to an orifice 71 protruding into process chamber 14. Therefore the tip of quartz glass nozzle 68, which is provided with orifice 71, protrudes somewhat beyond fluid surface 20 of the phosphoric acid in pan 16. Both the phosphoric acid and the sound are focused in quartz glass nozzle 68 if, due to the high-frequency ultrasound energy of piezoelectric element 65, the phosphoric acid that is contained in nozzle 68 is spattered via disk 66 beyond fluid surface 20 of the phosphoric acid in pan 16. A pronounced buildup of phosphoric acid mist 15 is generated in the area around the spattered phosphoric acid. As mentioned, the phosphoric acid droplets, which separate from the phosphoric acid mist on the impact element, are caught by pan 16.

The phosphoric acid that is compressed in quartz glass nozzle 68 so as to form the phosphoric acid mist 15 can flow out of pan 16 via radial boreholes 69.

It should be noted that device 10 depicted in FIG. 1 may also be equipped with a high-frequency ultrasound device that is configured in a different manner in place of high-frequency ultrasound device 11 in accordance with FIG. 2.

The invention claimed is:

1. A device for applying an even, thin fluid layer onto substrates for photovoltaic application, including:
a process chamber, provided with a fluid pan, a fluid-mist dropping shaft, and a high-frequency ultrasound device arranged to protrude into said fluid pan that converts the fluid into fluid mist;
a passage shaft arrangement for the substrate; and
a transport device that is arranged beneath said fluid-mist dropping shaft of said process chamber for the substrates, wherein:
said fluid-mist dropping shaft of said process chamber tapers in its interior cross-section towards said transport device and discharges into said passage shaft arrangement for the substrates that covers said transport device, and the interior cross-section of the orifice end of said fluid-mist dropping shaft and of said passage shaft arrangement are coordinated with each other.

2. The device as recited in claim 1, wherein:
said fluid-mist dropping shaft is wedge-shaped in the direction of said passage shaft arrangement.

3. The device as recited in claim 1, wherein:
said passage shaft arrangement in the passage direction downstream of the orifice of said dropping shaft a return shaft is arranged that is connected to said fluid pan, the rear end of the return shaft that faces away from the orifice being connected to a fluid tank.

4. The device as recited in claim 1, wherein:
in an area above said high-frequency ultrasound device an air supply pipe discharges that is connected to a first regulating device.

5. The device as recited in claim 4, wherein:
at the end of said passage shaft arrangement an air discharge channel is provided that is connected to a second regulating device.

6. The device as recited in claim 5, wherein:
between said passage shaft arrangement and said air discharge channel an extractor box is arranged that is provided with a laminar flow box that is connected to a suction fan.

7. The device as recited in claim 5, wherein:
said first and said second regulating device can be coordinated with each other, for the velocity of the mist as it moves from said process chamber through said passage shaft arrangement and the velocity of said transport device for the substrates.

8. The device as recited in claim 1, wherein:
said first and said second regulating device are synchronized.

9. The device as recited in claim 1, wherein:
an impact element that has a web, is provided within said process chamber above said high-frequency ultrasound device and said fluid pan.

10. The device as recited in claim 9, wherein:
a passage for the fluid mist is provided between the free end of a tilted impact element, which emerges from a process chamber wall that faces away from said dropping shaft and a dam that is arranged on the end of said fluid pan that faces away from said process chamber wall.

11. The device as recited in claim 9, wherein:
said impact web is plastic.

12. The device as recited in claim 1, wherein:
a cover of said process chamber is tilted at a rising slope as it emerges from the process chamber wall that faces away from said dropping shaft.

13. The device as recited in claim 1, wherein:
said wedge-shaped fluid-mist dropping shaft on its bordering walls is furnished with a web covering.

14. The device as recited in claim 13, wherein:
said bordering walls of said dropping shaft terminate in the orifice area of said passage shaft arrangement via runoff channels.

15. The device as recited in claim 1, wherein:
in accordance with a width of said transport device transverse to the passage direction and therefore of said process chamber, a multiplicity of high-frequency ultrasound devices are provided at pre-established intervals in this direction.

16. The device for applying an even, thin fluid layer, in particular a phosphoric acid layer, onto substrates, in particular silicon cells for photovoltaic application, including a process chamber, provided with a fluid pan and a high-frequency ultrasound device that converts the fluid into fluid mist, as recited in claim 1 wherein:
said high-frequency ultrasound device for atomizing the fluid is provided with a nozzle, preferably made of quartz glass, beneath which a high-frequency ultrasound generator is arranged.

17. The device as recited in claim 16, wherein:
supply lines are provided between said nozzle that protrudes from the fluid surface in said fluid pan and a high-frequency ultrasound generator to allow the fluid to flow from said pan into the nozzle.

18. The device as recited in claim 16, wherein:
said nozzle is held in a housing which is secured on the base of the fluid pan and penetrates this base in a fluid-tight manner, the high-frequency ultrasound generator is attached in said housing in the area of said pan base, and a multitude of radial supply boreholes are provided in the part of the housing that is located within said fluid pan.

19. The device as recited in claim 18, wherein:
said housing is plastic.

20. The device as recited in claims 16, wherein:
said high-frequency ultrasound generator is a piezoelectric element, on which a quartz glass plate is attached which faces said nozzle and is coordinated with the ultrasound frequency.

21. The device as recited in claim 20, wherein:
said quartz glass plate is glued to said piezoelectric element.

22. The device as recited in claim 1, wherein:
the fluid layer is a phosphoric layer.

23. The device as recited in claim 1, wherein:
said substrates are silicon cells.

24. The device as recited in claim 1, wherein:
the interior cross-section of the orifice end of said fluid-mist dropping shaft and the passage shaft arrangement are essentially identical.

* * * * *